(12) United States Patent
Kaushik et al.

(10) Patent No.: US 11,302,628 B2
(45) Date of Patent: Apr. 12, 2022

(54) INTEGRATED ASSEMBLIES HAVING CONDUCTIVE-SHIELD-STRUCTURES BETWEEN LINEAR-CONDUCTIVE-STRUCTURES

(71) Applicant: Micron Technology, Inc., Boise, ID (US)

(72) Inventors: Naveen Kaushik, Boise, ID (US); Yoshihiko Kamata, Kanagawa (JP); Richard J. Hill, Boise, ID (US); Kyle A. Ritter, Boise, ID (US); Tomoko Ogura Iwasaki, San Jose, CA (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 67 days.

(21) Appl. No.: 16/924,506

(22) Filed: Jul. 9, 2020

(65) Prior Publication Data

US 2022/0013450 A1 Jan. 13, 2022

(51) Int. Cl.
*H01L 23/522* (2006.01)
*H01L 27/11524* (2017.01)
*H01L 27/1157* (2017.01)
*H01L 27/11582* (2017.01)
*H01L 27/11556* (2017.01)

(52) U.S. Cl.
CPC ...... *H01L 23/5225* (2013.01); *H01L 23/5226* (2013.01); *H01L 27/1157* (2013.01); *H01L 27/11524* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| 2014/0269077 A1 | 9/2014 | Shih et al. |
| 2014/0374817 A1 | 12/2014 | Yoo |
| 2019/0295652 A1 | 9/2019 | Lin |
| 2019/0295941 A1 | 9/2019 | Ramaswamy |
| 2021/0005611 A1* | 1/2021 | Sukekawa ............... H01L 28/60 |

FOREIGN PATENT DOCUMENTS

| CN | 107993979 | 5/2018 |
| WO | WO PCT/US2021/040357 | 10/2021 |

* cited by examiner

*Primary Examiner* — Hsien Ming Lee
(74) *Attorney, Agent, or Firm* — Wells St. John P.S.

(57) ABSTRACT

Some embodiments include an assembly having channel-material-structures, and having memory cells along the channel-material-structures. The memory cells include charge-storage-material. Linear-conductive-structures are vertically offset from the channel-material-structures and are electrically coupled with the channel-material-structures. Intervening regions are between the linear-conductive-structures. Conductive-shield-structures are within the intervening regions. The conductive-shield-structures are electrically coupled with a reference-voltage-source.

40 Claims, 14 Drawing Sheets

INTEGRATED ASSEMBLIES HAVING CONDUCTIVE-SHIELD-STRUCTURES BETWEEN LINEAR-CONDUCTIVE-STRUCTURES

TECHNICAL FIELD

Integrated assemblies (e.g., integrated memory). Integrated assemblies having conductive-shield-structures between linear-conductive-structures (e.g., bitlines).

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line)

350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device 2121 is connected to the bitline $228_1$. The source of each drain-select device 212 is connected to the drain of the last charge-storage transistor 208 of the corresponding NAND string 206. For example, the source of drain-select device 2121 is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

DETAILED DESCRIPTION OF THE ILLUSTRATED EMBODIMENTS

Some embodiments include integrated assemblies (e.g., integrated memory, such as NAND memory) having conductive-shield-structures between linear-conductive-structures (e.g., bitlines). Example embodiments are described with reference to FIGS. 5-16. An axis system is are provided along some of the drawings to assist the reader in orienting the drawings relative to one another. The axis system includes an x-axis, a y-axis and a z-axis, with all of such axes being substantially orthogonal to one another.

Figure 1:
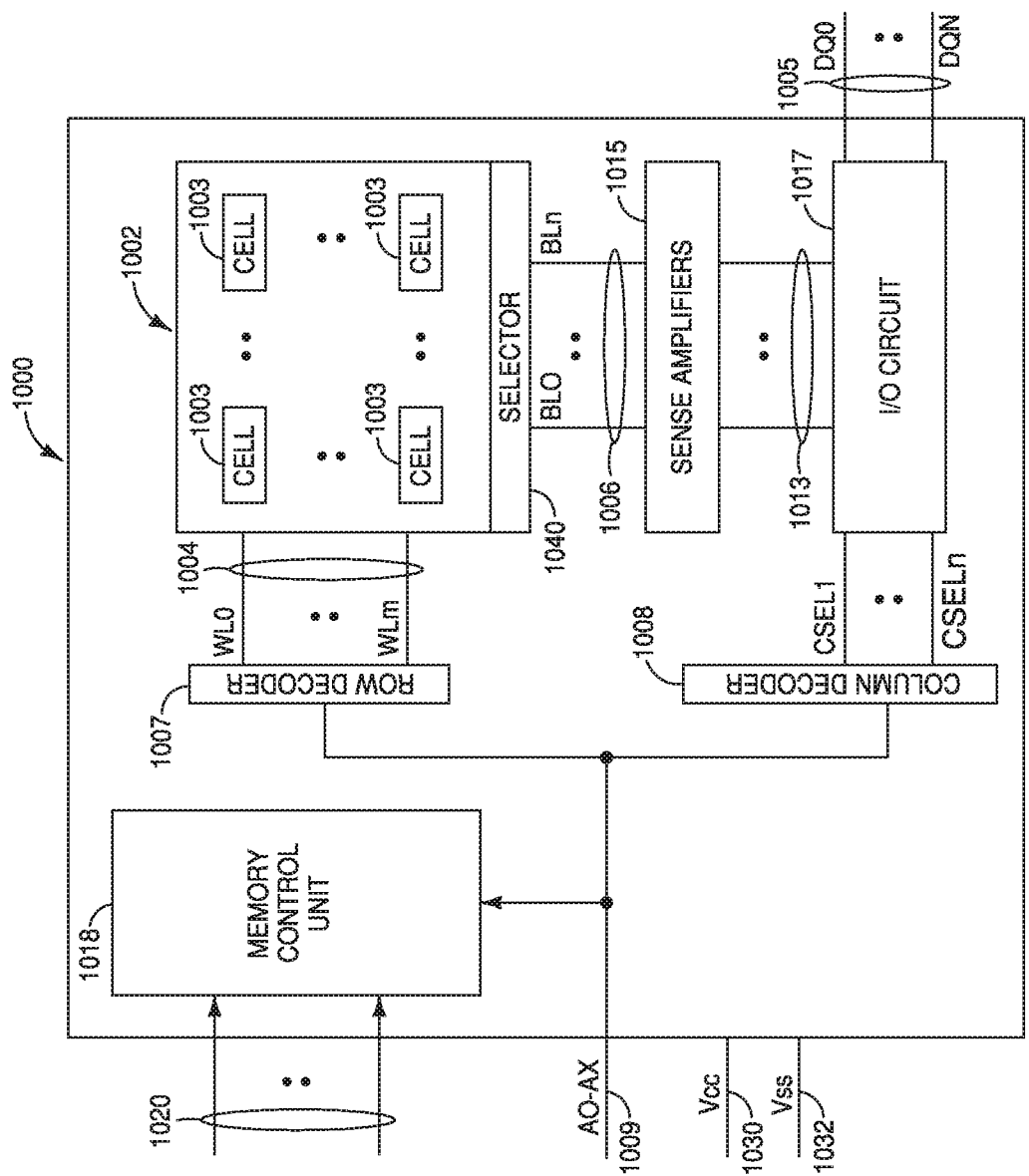
FIG. 1 shows a block diagram of a prior art memory device having a memory array with memory cells.
Figure 2:
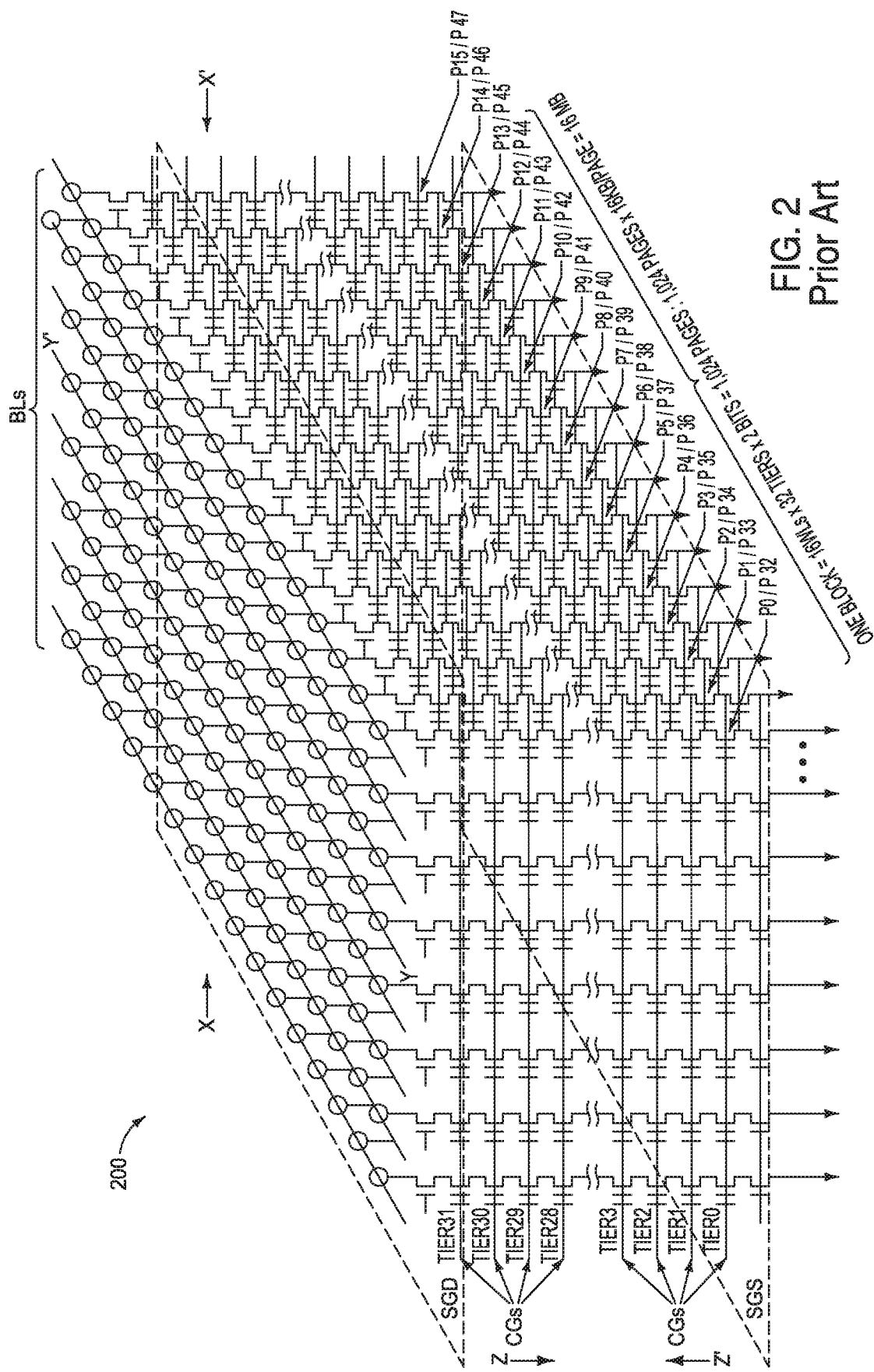
FIG. 2 shows a schematic diagram of the prior art memory array of FIG. 1 in the form of a 3D NAND memory device.
Figure 3:
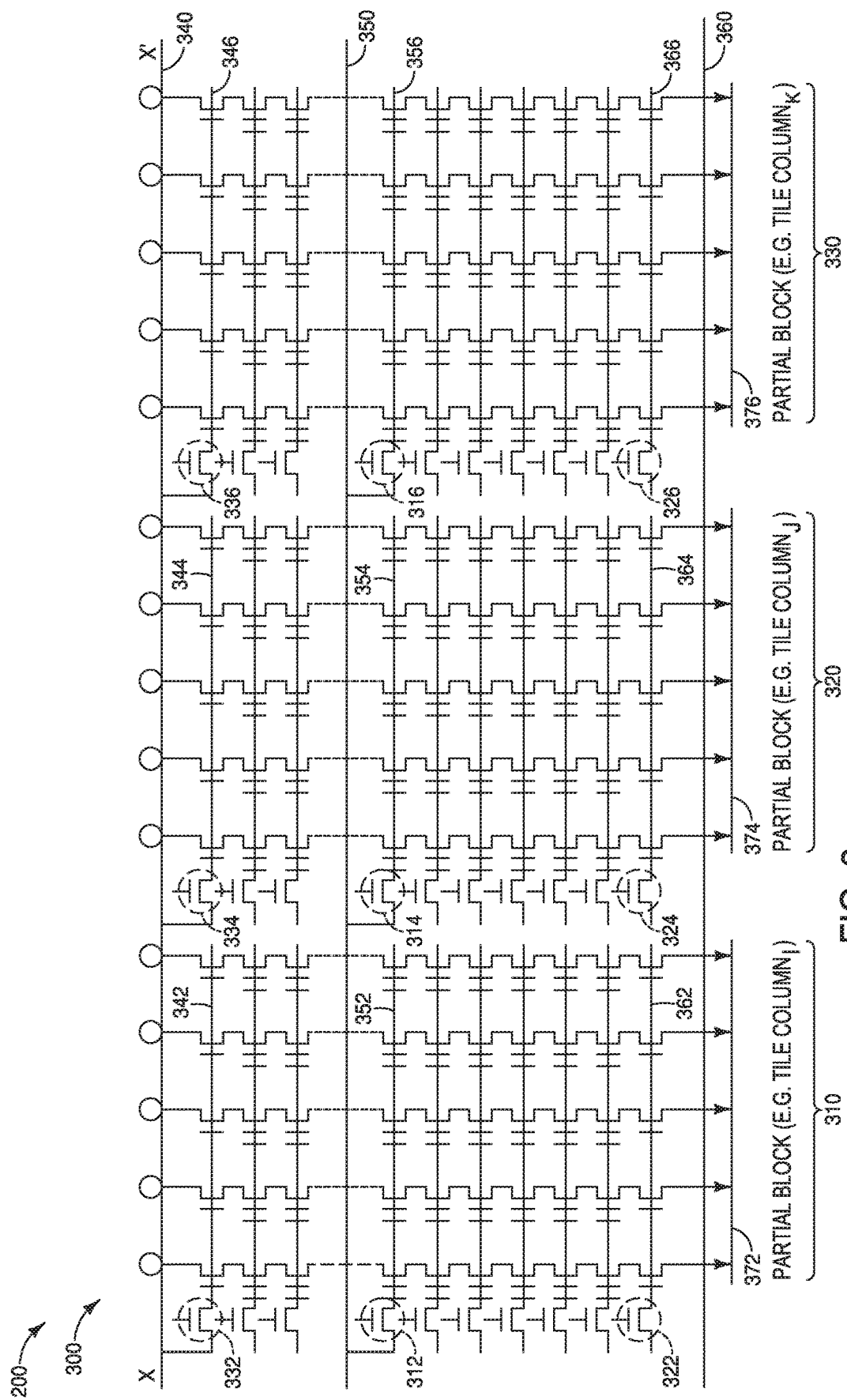
FIG. 3 shows a cross-sectional view of the prior art 3D NAND memory device of FIG. 2 in an X-X' direction.
Figure 4:
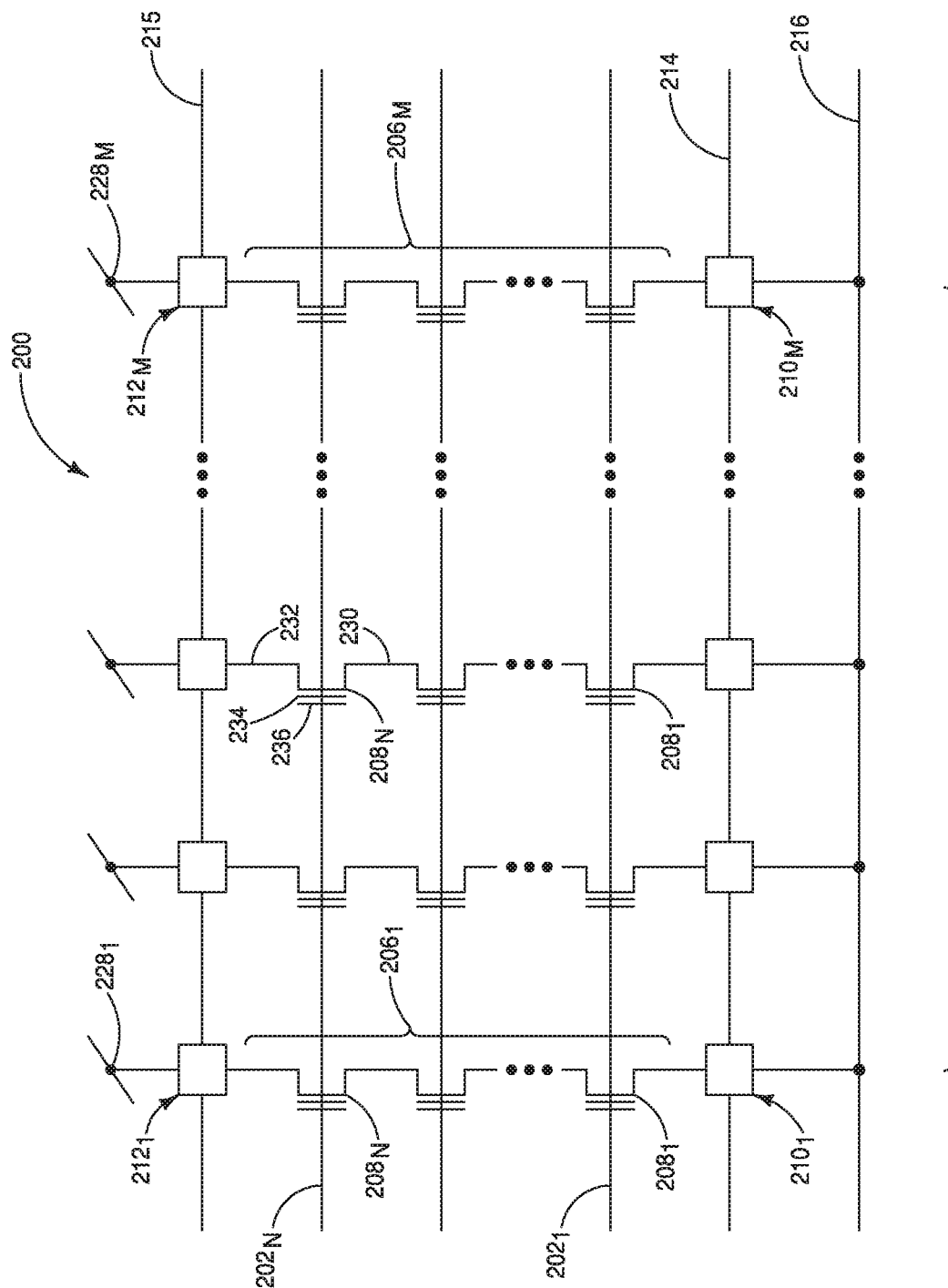
FIG. 4 is a schematic diagram of a prior art NAND memory array.
Figure 5:
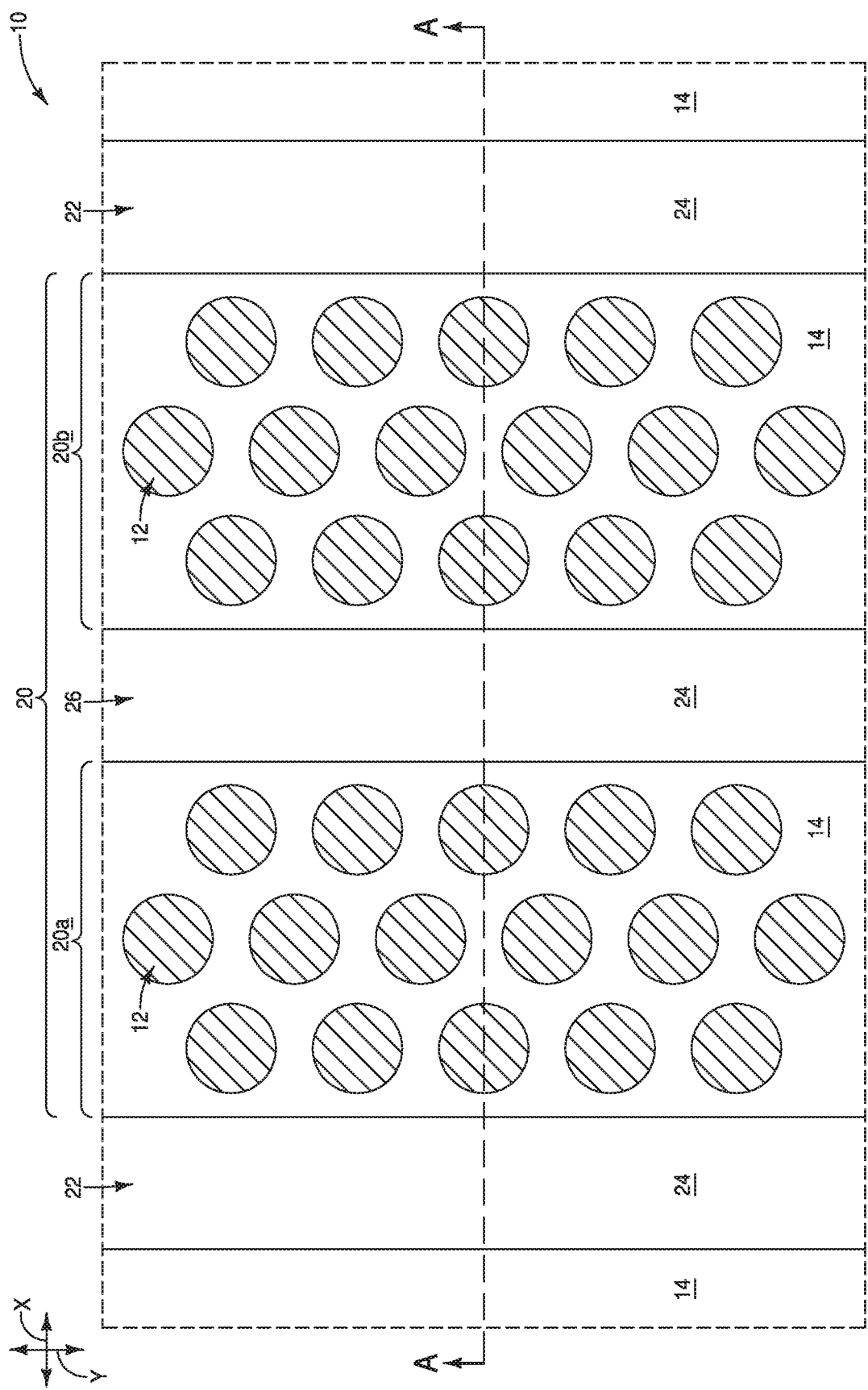
FIG. 5 is a diagrammatic top-down view of a region of an example integrated assembly.
Figure 5A:
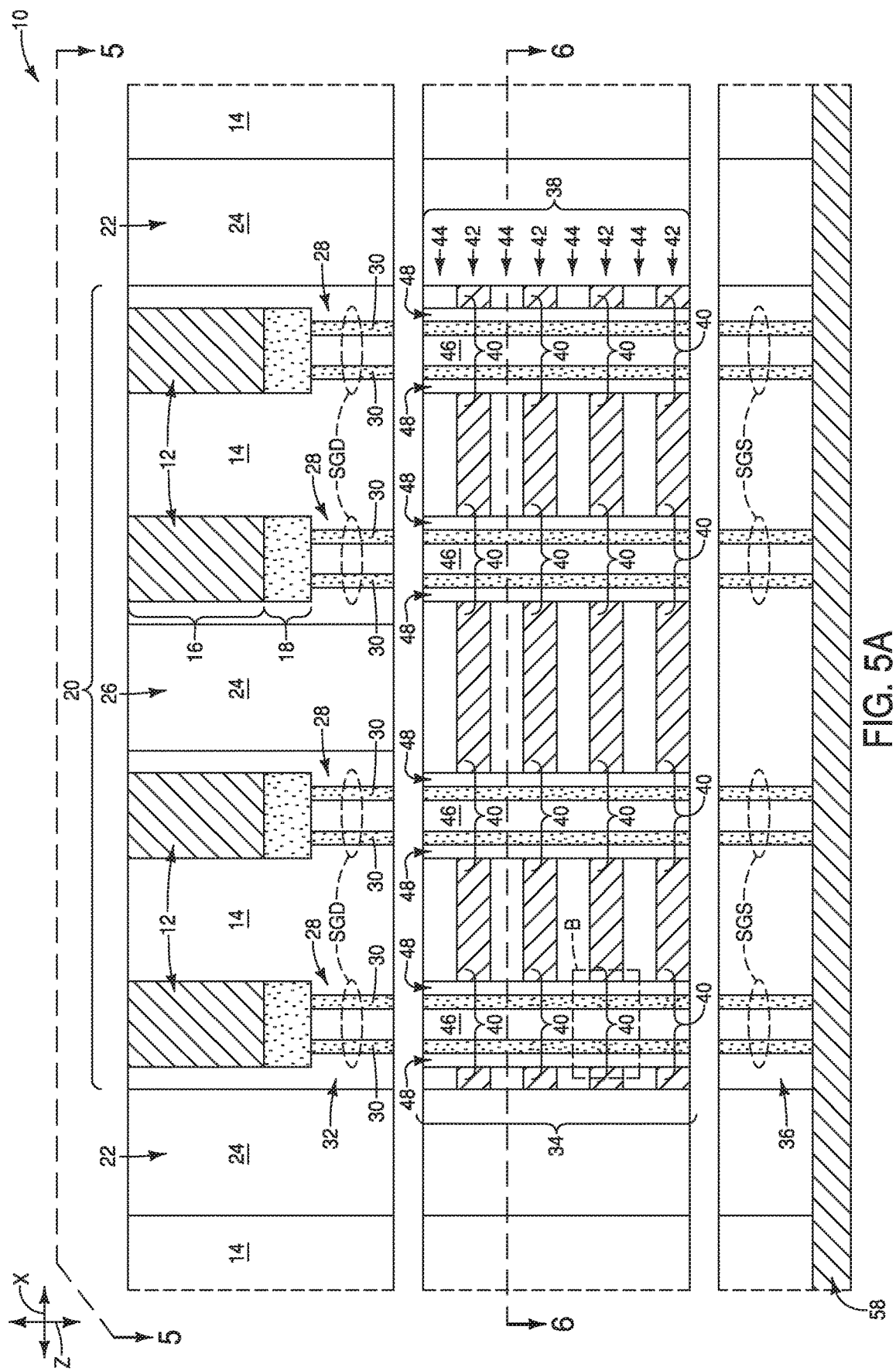
FIG. 5A is a diagrammatic cross-sectional side view along the line A-A of FIG. 5. The view of FIG. 5 is along the direction indicated by the line 5-5 of FIG. 5A.

Referring to FIGS. 5 and 5A, an integrated assembly 10 includes conductive interconnects 12 extending into an insulative material 14.

The conductive interconnects 12 may comprise any suitable configurations, and in the illustrated embodiment are shown to include metal-containing-regions 16 over conductively-doped-semiconductor-regions 18.

The metal-containing-regions 16 may comprise any suitable composition(s); such as, for example, one or more of various "pure" metals (e.g., titanium, tungsten, cobalt, nickel, platinum, ruthenium, etc.) and/or one or more of various metal-containing compositions (e.g., metal silicide, metal nitride, metal carbide, etc.). In some embodiments, the metal-containing-regions 16 may comprise, consist essentially of, or consist of tungsten.

The semiconductor material of the conductively-doped-semiconductor-regions 18 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the regions 18 may comprise silicon doped to a concentration of at least about $10^{20}$ atoms/cm$^3$ with appropriate conductivity-enhancing dopant (e.g., phosphorus, arsenic, boron, etc.). The semiconductor material of the conductively-doped-semiconductor-regions 18 is illustrated with stippling to assist the reader in distinguishing the semiconductor material relative to other materials.

The structures 12 are arranged within a memory block 20, and slits 22 are along opposing lateral edges of the memory block. The slits 22 are filled with insulative material 24 (e.g., silicon dioxide). In some embodiments, the slits may be filled with two or more different materials (e.g., each of the slits may be filled with a central conductive panel, and with a pair of outer insulative panels along opposing lateral surfaces of the central panel).

The structures 12 are also arranged within a pair of memory sub-blocks 20a and 20b, with such sub-blocks being spaced from one another by a slit 26 which is also filled with the insulative material 24.

The memory block 20, and the sub-blocks 20a and 20b, may correspond to memory blocks and sub-blocks the types described above with reference to FIGS. 1-4.

The conductive interconnects 12 are electrically coupled with channel-material-structures 28. In the illustrated embodiment, the channel-material-structures 28 are channel material-pillars which extend downwardly from the conductive interconnects 12.

The channel-material-structures 28 comprise semiconductor material 30. The semiconductor material 30 is illustrated with stippling to assist the reader in distinguishing the semiconductor material relative to other materials.

The semiconductor material 30 may comprise any suitable composition(s); and in some embodiments may comprise, consist essentially of, or consist of one or more of silicon, germanium, III/V semiconductor material (e.g., gallium phosphide), semiconductor oxide, etc. In some embodiments, the semiconductor material 30 may comprise appropriately-doped silicon.

The channel-material-structures 28 have upper regions 32 associated with drain-side select gate (SGD) devices, lower regions 36 associated with source-side select gate (SGS) devices, and central regions 34 associated with memory cells 40.

The central regions 34 pass through a stack 38 of alternating conductive levels 42 and insulative levels 44. The vertically-stacked memory cells 40 along an individual pillar 28 may correspond to a vertical string of memory cells (i.e., a vertical NAND string). The number of memory cells in each string may be determined by the number of conductive levels (layers) 42. The stack 38 may comprise any suitable number of conductive levels 42; including, for example, 8 levels, 16 levels, 32 levels, 64 levels, 128 levels, 256 levels, 512 levels, 1024 levels, etc. Gaps are provided above and below the central regions 34 of the pillars 28 to indicate that the stack 38 may extend to include more than the illustrated number of the conductive levels 42.

The conductive levels 42 may comprise any suitable composition(s). For instance, in some embodiments the conductive levels 42 may comprise one or more of titanium nitride, tungsten nitride and tungsten.

The insulative levels 44 may comprise any suitable composition(s). For instance, in some embodiments the insulative levels 44 may comprise silicon dioxide.

The channel-material-pillars 28 are shown to be hollow, and to laterally surround an insulative material 46. The insulative material 46 may comprise any suitable composition(s), and in some embodiments may comprise, consist essentially of, or consist of silicon dioxide. In some embodiments the insulative material 46 may be omitted and the channel-material-pillars 28 may be solid pillars rather than being the illustrated hollow pillars.

Figure 5B:
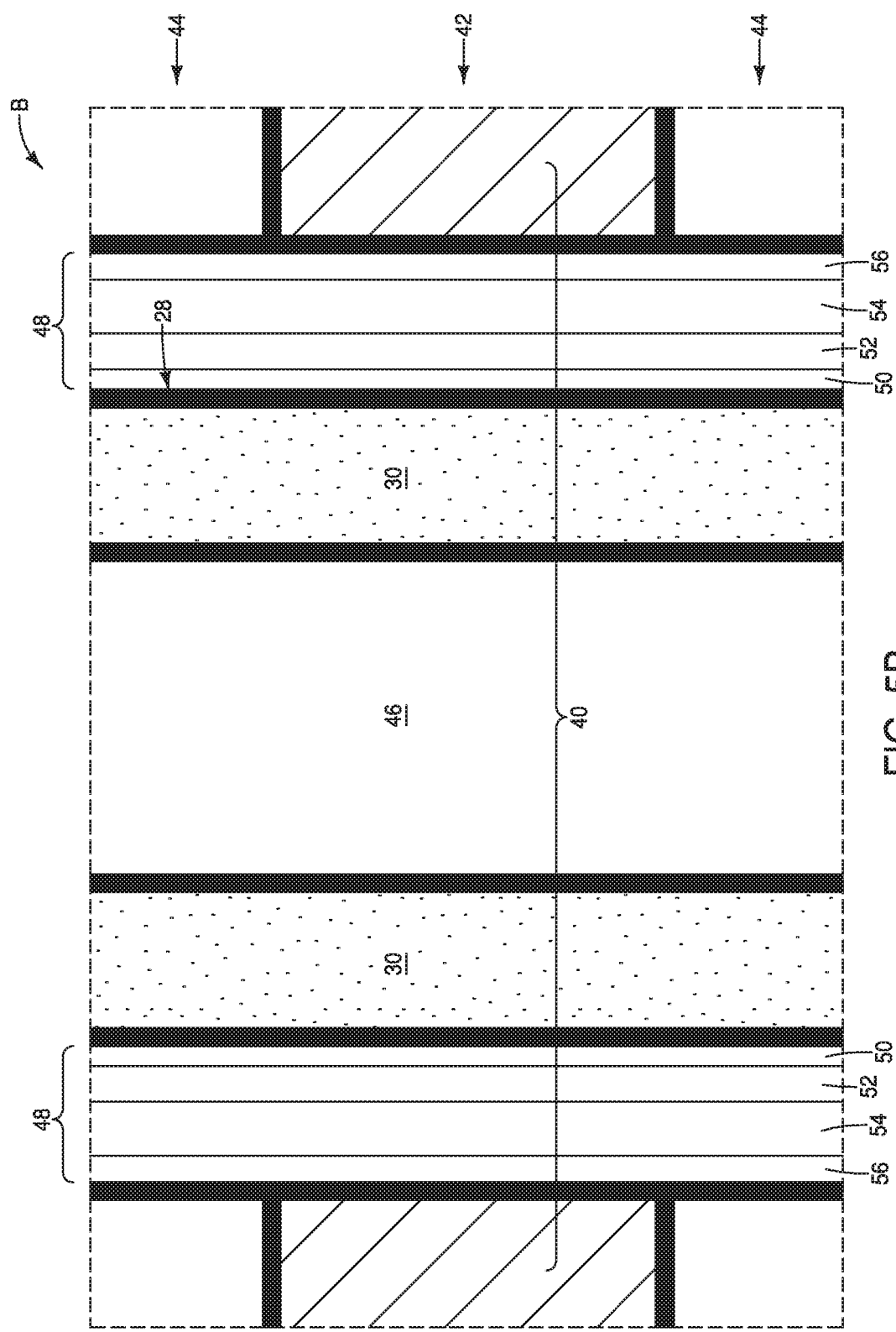
FIG. 5B is an enlarged cross-sectional side view of a region "B" of FIG. 5A.

The channel material-pillars 28 are offset from edges of the conductive layers 42 by intervening regions 48 comprising cell materials. FIG. 5B shows an enlarged region of one of the memory cells 40, and shows the intervening regions 48 comprising cell materials which include gate-dielectric-material (insulative material, tunneling material) 50, charge-storage-material 52, charge-blocking-material 54 and dielectric-barrier-material 56.

The gate-dielectric-material (tunneling material) 50 may comprise any suitable composition(s); and in some embodiments may comprise one or more of silicon dioxide, silicon nitride, aluminum oxide, hafnium oxide, zirconium oxide, etc. In some embodiments, the material 50 may comprise a bandgap-engineered laminate.

The charge-storage-material 52 may comprise any suitable composition(s), and in some embodiments may comprise charge-trapping-material (e.g., one or more of silicon nitride, silicon oxynitride, conductive nanodots, etc.).

The charge-blocking-material 54 may comprise any suitable composition(s), and in some embodiments may comprise one or both of silicon dioxide and silicon oxynitride.

The dielectric-barrier-material 56 may comprise any suitable composition(s); and may, for example, comprise one or more high-k compositions (e.g., aluminum oxide, hafnium oxide, zirconium oxide, etc.). The term "high-k composition" means a composition having a dielectric constant greater than the dielectric constant associated with silicon dioxide (i.e., greater than about 3.9). In some embodiments, the dielectric-barrier material 56 may be provided to extend around outer peripheries of the conductive material within the conductive levels 42 alternatively to, or in addition to, being provided to extend vertically through the stack 38 within the intervening regions 48.

The cell materials within the intervening regions 48 may or may not extend along one or both of the upper and lower regions 32 and 36 of the channel-material-structures 28. In the illustrated embodiment of FIG. 5A the cell materials are shown to not be along the upper and lower regions 32 and 36 of the channel-material-structures 28 in order to simplify the drawing.

Figure 6:
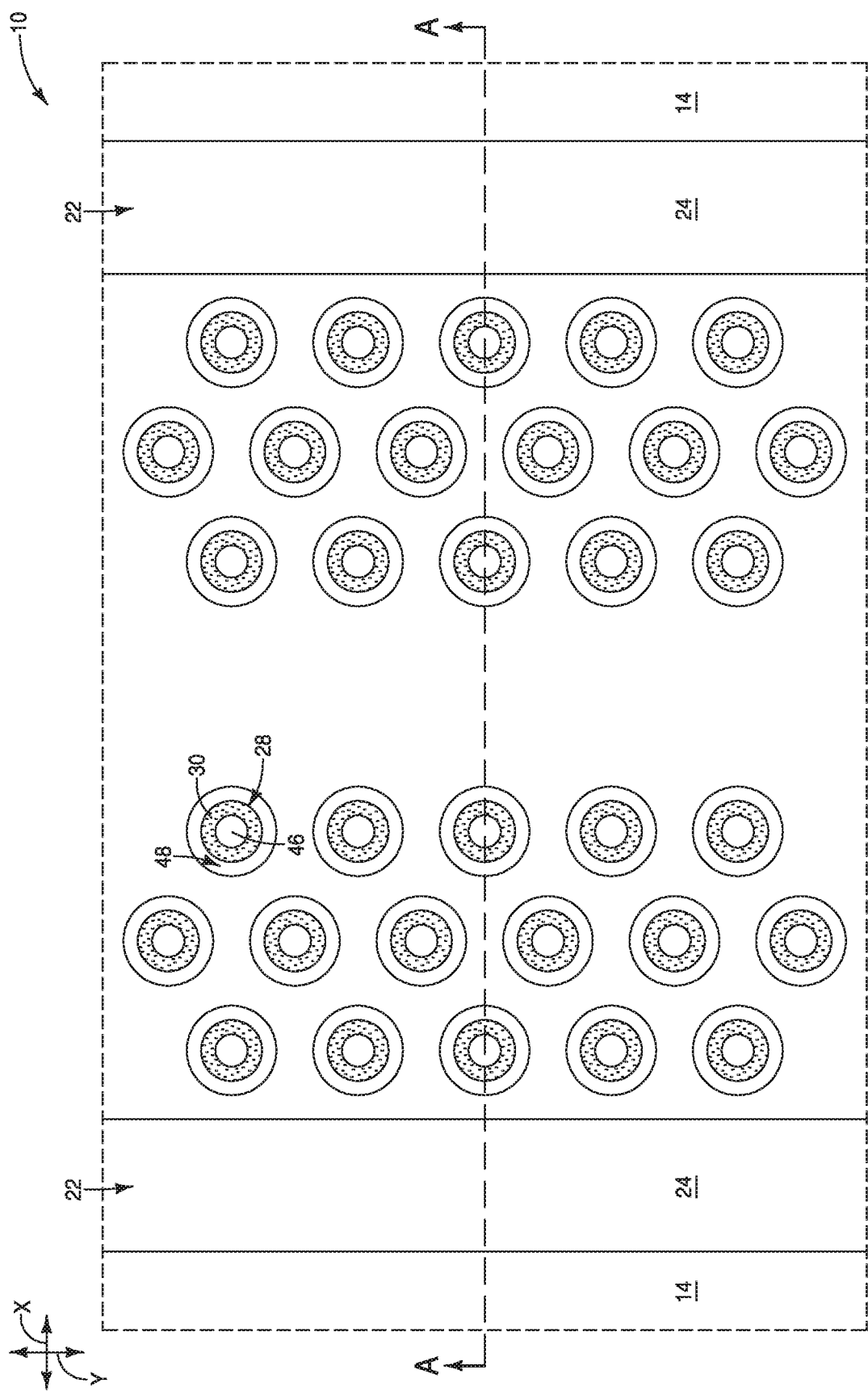
FIG. 6 is a diagrammatic top-down view along the line 6-6 of FIG. 5A.

FIG. 6 shows a top-down view along one of the insulative levels 44, and shows the channel-material-pillars 28 configured as annular rings extending around the insulative material 46. The cell materials within the regions 48 are configured as annular rings extending around the channel material 30 of the pillars 28.

Referring again to FIG. 5A, the channel material 30 of the pillars 28 extends downwardly to be electrically coupled with a conductive structure 58. The conductive structure 58 may be a source structure. The source structure may comprise any suitable composition(s). For instance, the source structure may comprise conductively-doped silicon over tungsten silicide.

The source structure 58 may be supported by a semiconductor base (not shown). The semiconductor base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base may correspond to a semiconductor substrate containing one or more materials associated with integrated circuit fabrication. Such materials may include, for example, one or more of refractory metal materials, barrier materials, diffusion materials, insulator materials, etc.

The various components and structures described with reference to FIGS. 5-5B and 6 may be analogous to the components and structures described above with reference to FIGS. 1-4.

Figure 7:
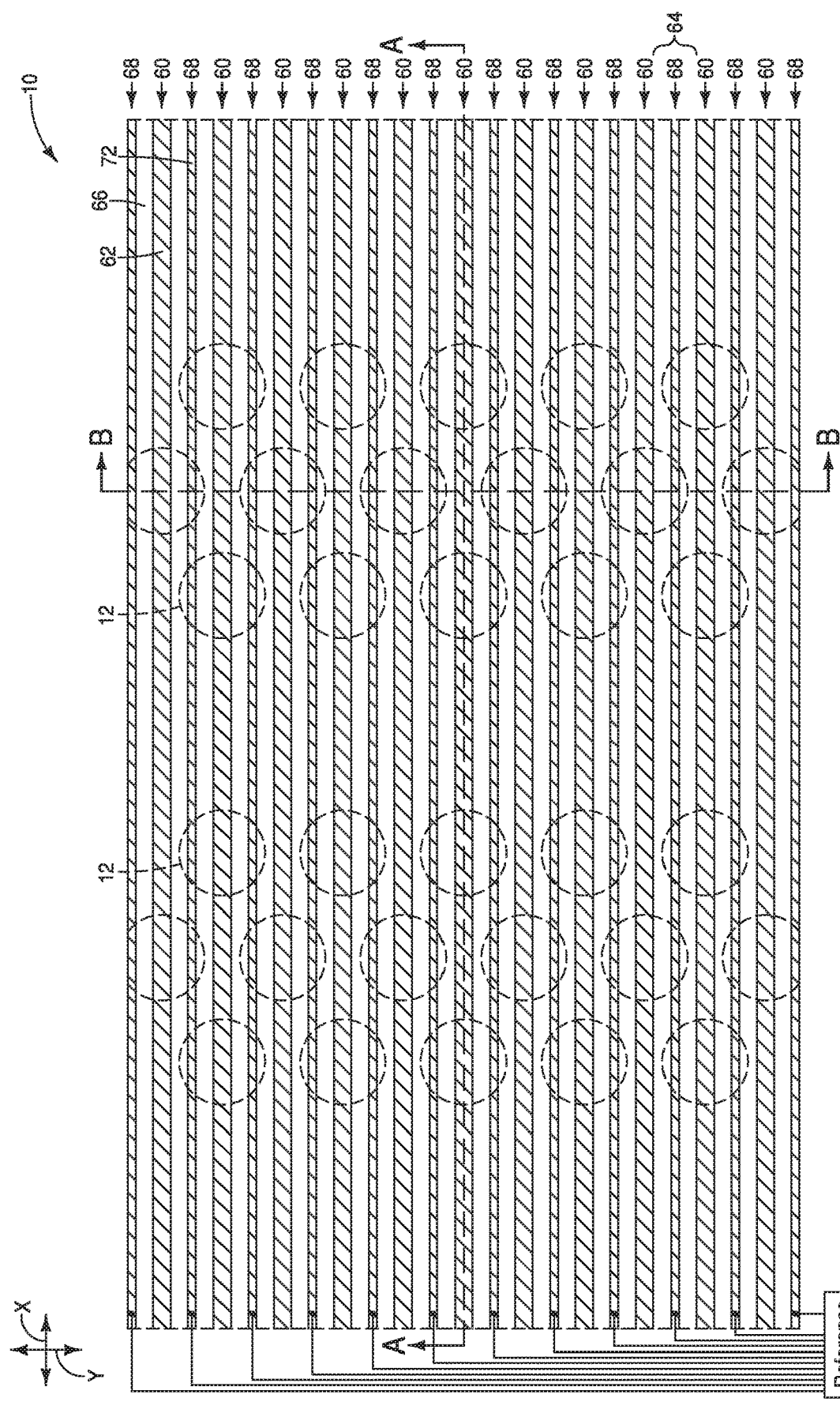
FIG. 7 is a diagrammatic top-down view of a region of an example integrated assembly. The view of FIG. 7 may be at a process stage subsequent to that of FIG. 5.
Figure 7A:
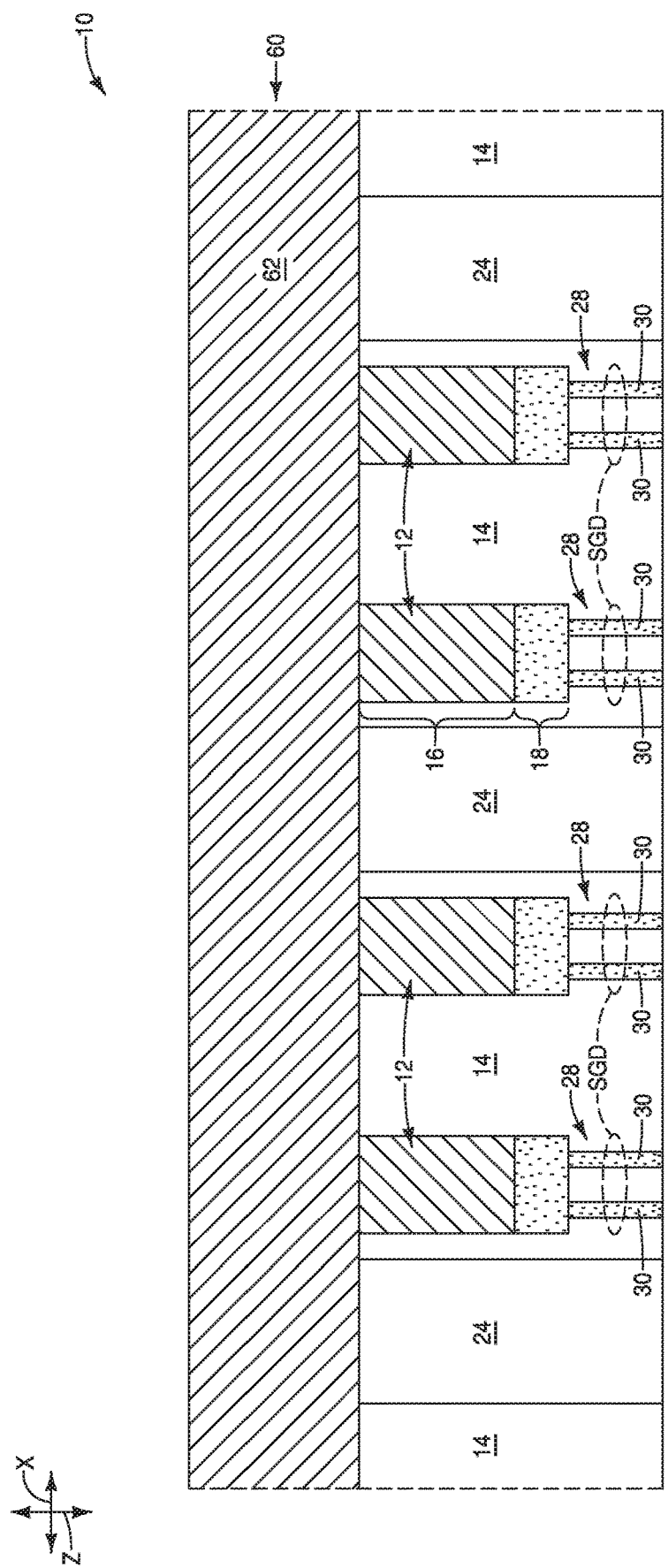
FIG. 7A is a diagrammatic cross-sectional side view along the line A-A of FIG. 7.
Figure 7B:
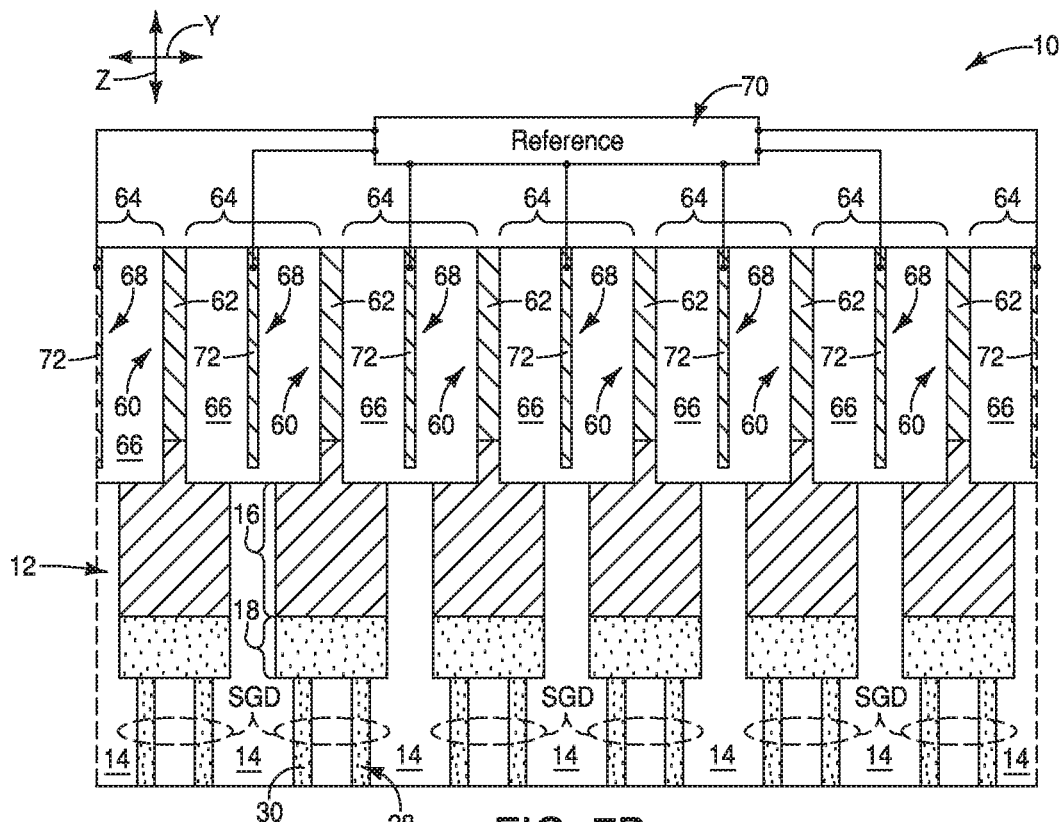
FIG. 7B is a diagrammatic cross-sectional side view along the line B-B of FIG. 7.

Referring to FIGS. 7-7B, linear-conductive-structures 60 are formed to extend across the interconnects 12. The interconnects 12 are shown in dashed-line (phantom) view in FIG. 7 to indicate that the interconnects are beneath other materials. It is noted that only portions of the channel-material-structures 28 are shown in the cross-sections of FIGS. 7A and 7B, rather than showing all of the structures and components described above with reference to FIG. 5A, in order to simplify the drawings. However, it is to be understood that the entirety of the configuration of FIG. 5A would be present along the cross-sections of FIGS. 7A and 7B.

The linear-conductive-structures 60 are electrically coupled with the interconnects 12. Accordingly, the linear-conductive-structures 60 are electrically coupled to the channel-material-structures 28 through the interconnects 12. The linear-conductive-structures 60 may correspond to bitlines (sense lines, digit lines). The linear-conductive-structures may be straight (as shown), or may be curved, wavy, etc.

The linear-conductive-structures (bitlines) 60 may be coupled with sense-amplifier-circuitry (not shown).

The linear-conductive-structures (bitlines) 60 comprise conductive material 62. The conductive material 62 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 62 may be a metal-containing material (e.g., may comprise one or more of tungsten, titanium, ruthenium, etc.).

The linear-conductive-structures (bitlines) 60 are vertically offset from the channel-material-structures 28 in the illustrated embodiment, and specifically are shown to be above the channel-material-structures 28.

The linear-conductive-structures 60 are spaced from one another by intervening regions 64. Dielectric material 66 is provided within the intervening regions 64, and conductive-shield-structures 68 extend into the dielectric material 66.

The dielectric material 66 may comprise any suitable composition(s). In some embodiments, the dielectric material 66 may comprise silicon dioxide. In some embodiments, the dielectric material 66 may comprise low-k material, with the term low-k meaning a dielectric constant less than that of silicon dioxide (i.e., less than about 3.9). In some embodiments, the dielectric material 66 may comprise porous silicon oxide and/or silicon oxide doped with one or more dopants to reduce a dielectric constant of the silicon oxide. For instance, the dielectric material 66 may include one or both of carbon-doped silicon oxide and boron-doped silicon oxide. Alternatively, or additionally, the dielectric material 66 may comprise porous silicon nitride. In some embodiments, the dielectric material 66 may include gas-filled voids. In some embodiments, the dielectric material 66 may comprise a laminate of two or more compositions.

The conductive-shield-structures 68 comprise conductive material (shield material) 72. The shield material 72 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal boride, metal nitride, metal carbide, etc.), and/or conductively-doped semiconductor materials (e.g., conductively-doped silicon, conductively-doped germanium, etc.).

The conductive-shield-structures 68 are electrically coupled with a reference-voltage-source 70 (Reference). The reference-voltage-source may be at any suitable reference voltage, including, for example, ground, VCC/2, etc. In some embodiments, the reference-voltage-source may remain at a static voltage during operation of the memory cells 40 (FIG. 5A). In other embodiments, the reference-voltage-source may be dynamically controlled (i.e., the voltage may be varied) during operation of the memory cells.

The shield structures 68 may advantageously reduce parasitic capacitance between the linear-conductive-structures (bitlines) 60. In some embodiments, the shield structures 68 may reduce the parasitic capacitance between the linear-conductive-structures 60 to be less than or equal to about 5 attofarads (aF). In some embodiments, the shield structures 68 may reduce such parasitic capacitance to be about zero. The parasitic capacitance between neighboring bitlines becomes increasingly problematic with increasing levels of integration. The shield structures 68 described herein may advantageously alleviate, or even prevent, such problematic parasitic capacitance which may enable the memory configurations described herein to be formed to higher levels of integration than can be satisfactorily achieved with conventional configurations.

Figure 8:
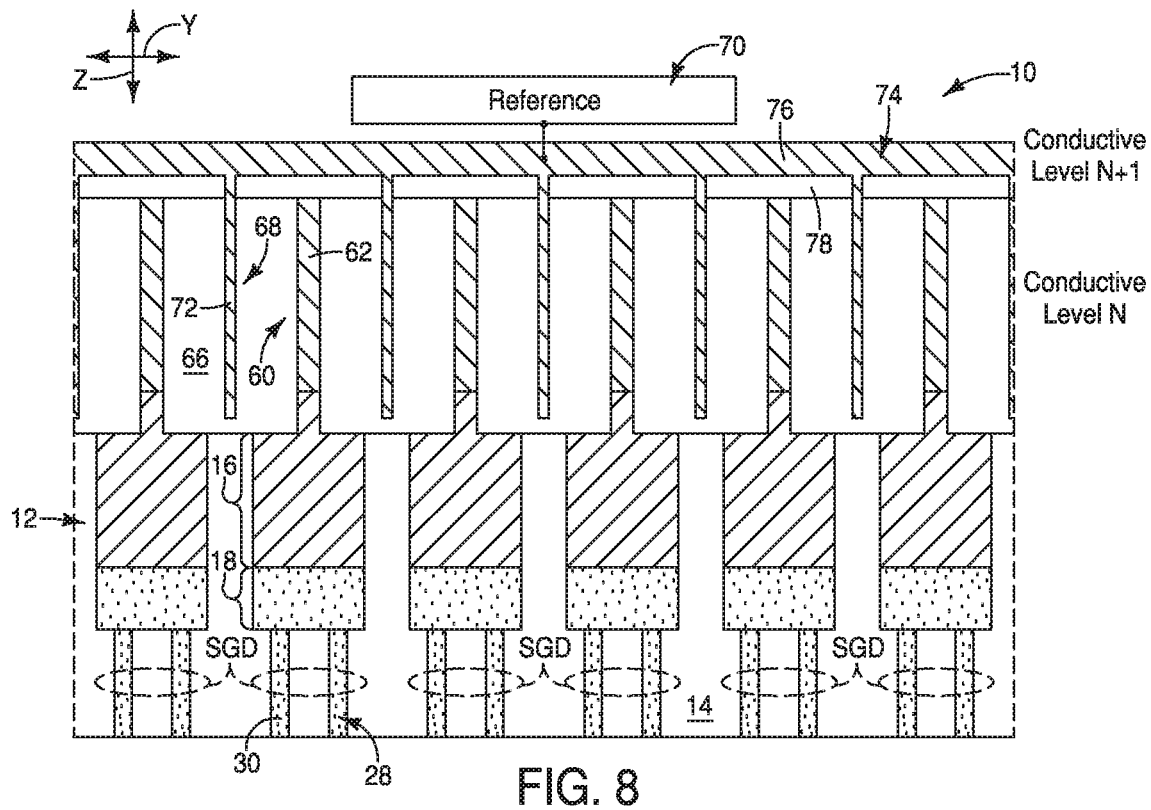
FIGS. 8 and 9 are diagrammatic cross-sectional side views of the region of FIG. 7B shown in accordance with specific example embodiments.
Figure 9:
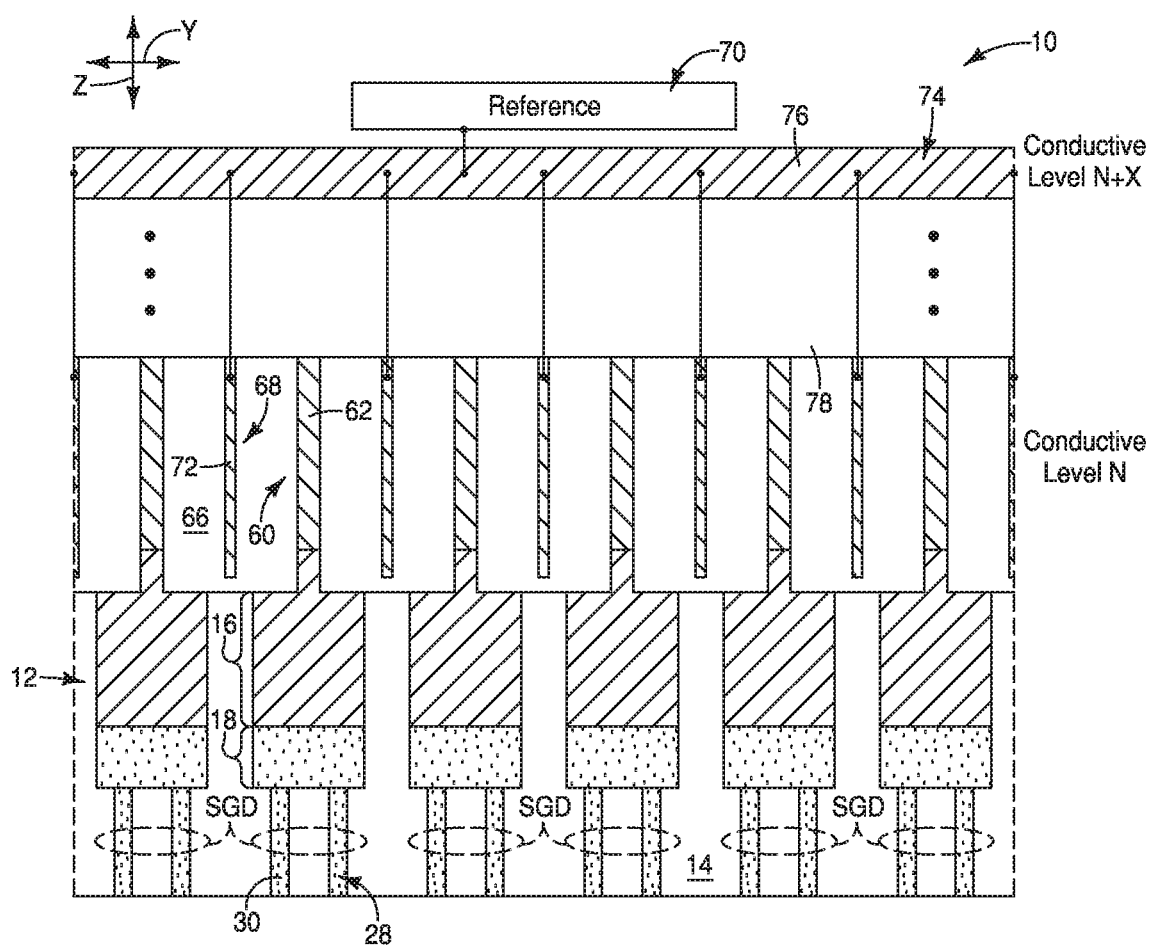

In some embodiments, the conductive-shield-structures 68 may be coupled to the reference-voltage-source 70 through a conductive plate (i.e., a reference-plate-structure). Example embodiments are described with reference to FIGS. 8 and 9. The difference between FIGS. 8 and 9 is the elevational level at which the conductive plate is formed. Specifically, it is common for conductive layers to be formed along elevational levels, with each elevational level corresponding to a particular stage of a fabrication sequence. In some embodiments, the conductive plate may be formed at a conductive level immediately above the conductive level comprising the shield structures 68, and in other embodiments the conductive plate may be formed at a conductive level which is offset from the conductive level of the shield structures 68 by one or more intervening conductive levels.

FIG. 8 shows a configuration in which the conductive-shield-structures 68 are at a first level corresponding to Conductive Level N, and in which a reference-plate-structure 74 is at a second level corresponding to Conductive Level N+1. In other words, the reference-plate-structure 74 is at a conductive level immediately above the conductive level of the shield structures 68.

The reference-plate-structure 74 comprises conductive material 76. The conductive material 76 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 76 may comprise a same composition as the conductive material 72 of the shield structures 68.

The reference-plate-structure 74 is electrically coupled with the reference-voltage-source 70.

Insulative material 78 is provided between the reference-plate-structure 74 and the bitlines 60. The insulative material 78 may comprise any suitable composition(s), and in some embodiments may comprise silicon dioxide.

FIG. 9 shows a configuration similar to that of FIG. 8, except that the reference-plate-structure 74 is at a Conductive Level N+X (where X is greater than 1). In other words, the reference-plate-structure 74 is at a conductive level which is offset from the first conductive level of the shield structures 68 (i.e., the Conductive Level N) by one or more intervening conductive levels.

The dielectric material 66 and shield structures 68 may have any suitable configurations within the intervening regions 64 (labeled in FIG. 7B) between the linear-conductive-structures (bitlines) 60. Example configurations are described with reference to FIGS. 10-14.

Figure 10:
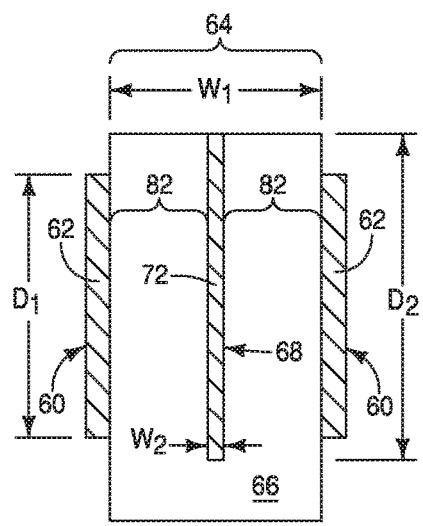
FIGS. 10-14 are diagrammatic cross-sectional side views of regions of example integrated assemblies shown in accordance with specific example embodiments.

Referring to FIG. 10, an intervening region 64 between a pair of neighboring linear-conductive-structures (bitlines) 60 is shown to have a first width (first thickness) $W_1$ along the cross-section of the figure, and the shield structure 68 is shown to have a second width (second thickness) $W_2$ along such cross-section. The first width $W_1$ may have any suitable dimension, and in some embodiments may have a dimension within a range of from about 10 nanometers (nm) to about 20 nm. The second width $W_2$ may have a dimension which is within a range of from about 10% to about 60% of the first width, and in some embodiments may have a dimension which is within a range of from about 20% to about 40% of the first width.

Figure 11:
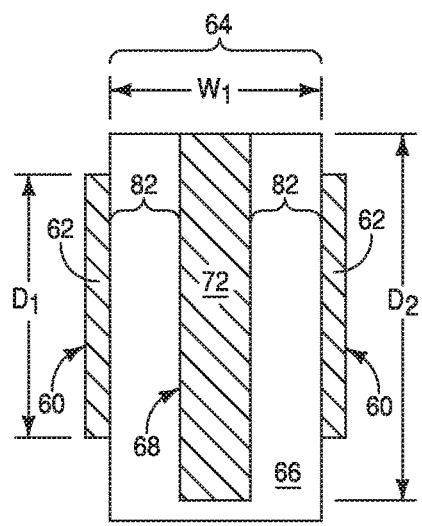

FIG. 11 shows a configuration similar line of FIG. 10, except that it shows the second width $W_2$ larger than is shown in FIG. 10. The configuration of FIG. 10 shows the second width $W_2$ less than about one-third of the first width $W_1$, and the configuration of FIG. 11 shows the second width $W_2$ greater then are equal to about one-third of the first width $W_1$.

Figure 12:
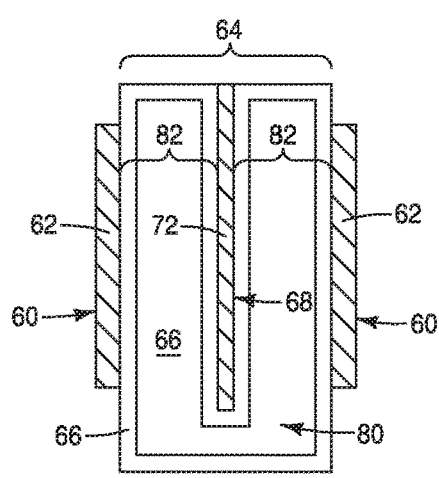

In some embodiments, the intervening regions 64 may comprise gas-filled voids in addition to the dielectric material 66. For instance, FIG. 12 shows an example configuration in which a gas-filled void 80 is within the intervening region 64. The gas-filled void 80 is sealed by the insulative material 66. The illustrated gas-filled void extends along sides of the shield structures 68, and also extends to under the shield structures 68. In other embodiments, the gas-filled void 80 may extend along the sides of the shield structures 68 without extending to under the shield structures 68.

Figure 13:
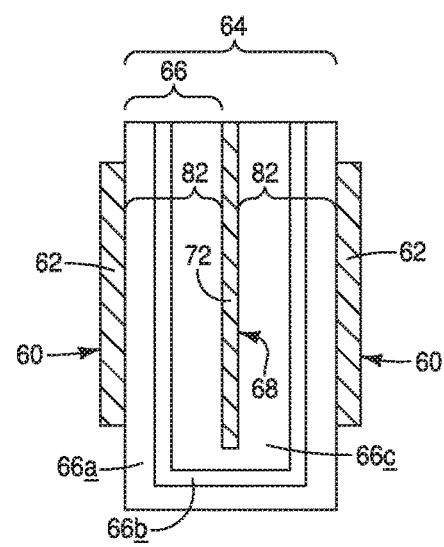
Figure 14:
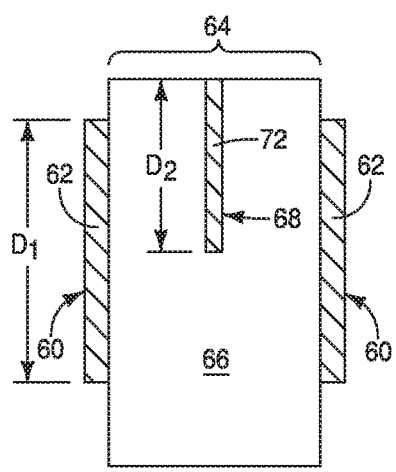

In some embodiments, the dielectric material 66 may comprise a laminate of two or more different compositions. FIG. 13 shows an embodiment in which the dielectric material 66 comprises a laminate of three different compositions 66a, 66b and 66c. The compositions may or may not all be low-k compositions, and may be selected from any of the example composition as described above as being suitable for the dielectric material 66.

In some embodiments, the dielectric material 66 may be considered to form dielectric regions 82 between the shield structures 68 and the bitlines (linear-conductive-structures) 60. The dielectric regions 82 are labeled in FIG. 10-13. FIGS. 10 and 11 show that such dielectric regions may be homogeneous in some embodiments, while FIGS. 12 and 13 show that such dielectric regions may be heterogeneous in other embodiments.

The bitlines 60 of FIGS. 10-13 may be considered to have a first vertical dimension $D_1$ along the cross-sections of the figures, with such vertical dimension being labeled relative to FIGS. 10 and 11. The conductive-shield-structures 68 may be considered to have second vertical dimensions $D_2$, with example second vertical dimensions being labeled in FIGS. 10 and 11. The second vertical dimensions $D_2$ may be greater than the first vertical dimensions $D_1$ in some embodiments. In other embodiments, such as the embodiment shown in FIG. 14, the second vertical dimension $D_2$ may be less than the first vertical dimension $D_1$. The relative size of the second vertical dimension $D_2$ to the first vertical dimension $D_1$ may be tailored to achieve a desired reduction in parasitic capacitance between neighboring bitlines 60 while also maintaining desired current flow through the bitlines, desired $I_{on}/I_{off}$ characteristics, etc. The composition of the dielectric regions 82 may also be tailored, and/or the relative thickness of $W_2$ to $W_1$ may also be tailored, to further achieve the desired reduction in parasitic capacitance between neighboring bitlines 60 while maintaining desired current flow along the bitlines, desired $I_{on}/I_{off}$ characteristics, etc.

Figure 15:
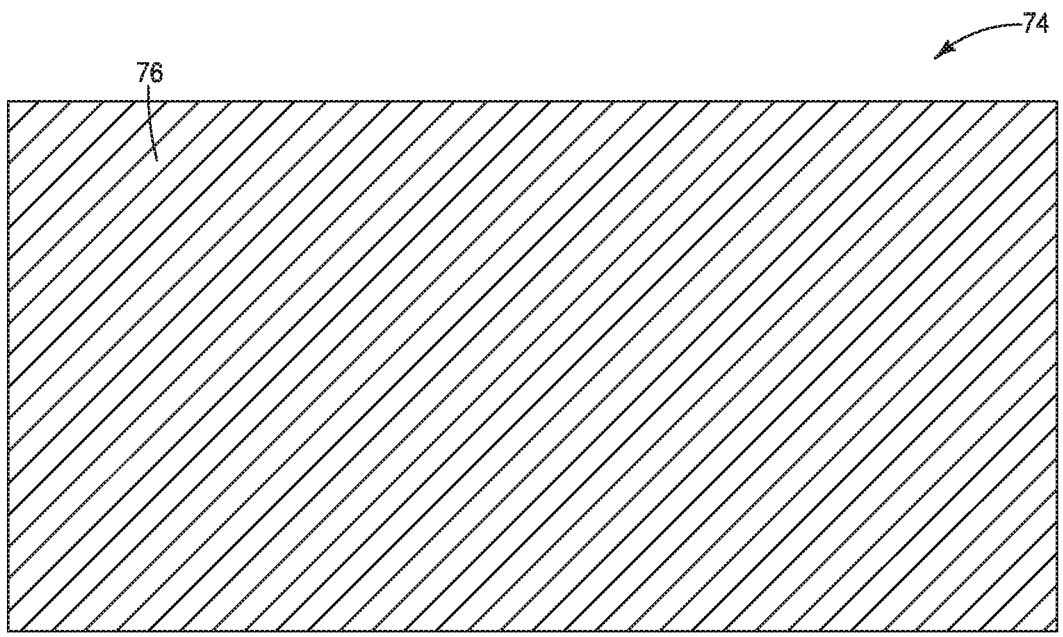
FIGS. 15 and 16 are diagrammatic top-down views of regions of example integrated assemblies shown in accordance with specific example embodiments.
Figure 16:
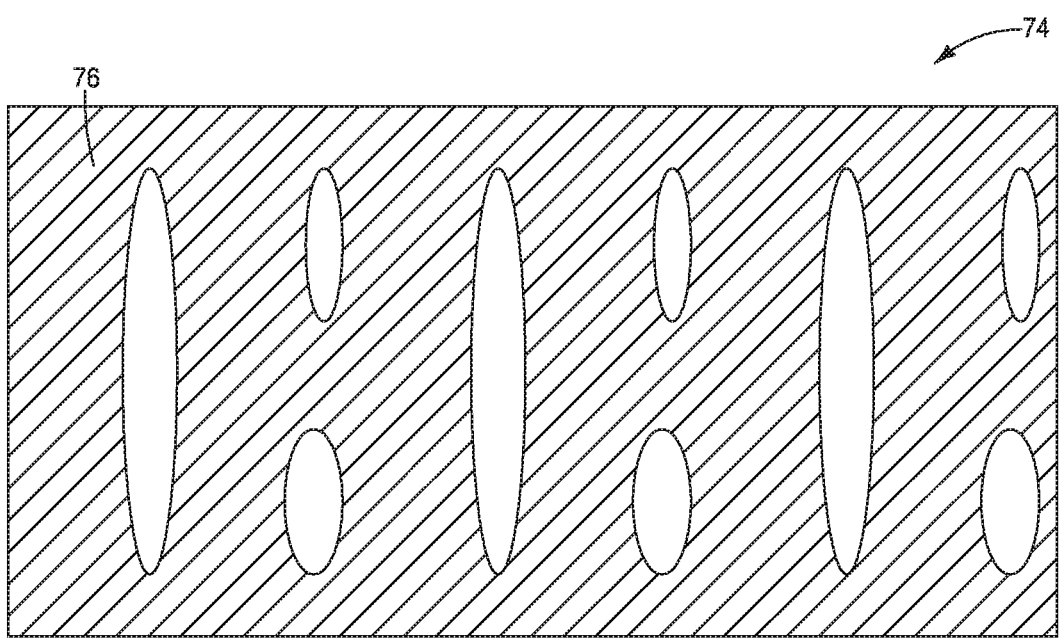

The plates 74 of FIGS. 8 and 9 may have any suitable configurations. In some embodiments, the plates may be solid across entire expanse of such plates, as shown in FIG. 15. In other embodiments, the plates may be perforated (waffled) as shown in FIG. 16.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an assembly having channel-material-structures, and memory cells along the channel-material-structures. The memory cells include charge-storage-material. Linear-conductive-structures are vertically offset from the channel-material-structures and are electrically coupled with the channel-material-structures. Intervening regions are between the linear-conductive-structures. Conductive-shield-structures are within the intervening regions. The conductive-shield-structures are electrically coupled with a reference-voltage-source.

Some embodiments include an assembly having channel-material-pillars and memory cells along the channel-material-pillars. The memory cells include charge-storage-material, charge-blocking-material and tunneling material. Linear-conductive-structures are vertically offset from the channel-material-pillars and are electrically coupled with the channel-material-pillars through conductive interconnects. The linear-conductive-structures are spaced from one another by intervening regions. Conductive-shield-structures are within the intervening regions and are spaced from the linear-conductive-structures by insulative regions.

Some embodiments include an assembly having channel-material-pillars and memory cells along the channel-material-pillars. The memory cells include charge-storage-material. Linear-conductive-structures are vertically offset from the channel-material-pillars and are electrically coupled with the channel-material-pillars. Intervening regions are between the linear-conductive-structures. Conductive-shield-structures are within the intervening regions. A reference-plate-structure is over the conductive-shield-structures and is coupled with the conductive-shield-structures.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An assembly, comprising:
channel-material-structures;
memory cells along the channel-material-structures; the memory cells including charge-storage-material;
linear-conductive-structures electrically coupled with the channel-material-structures, an entirety of each of the linear-conductive-structures being vertically offset from an entirety of the channel-material-structures; intervening regions being between the linear-conductive-structures; and
conductive-shield-structures within the intervening regions and being electrically coupled with a reference-voltage-source.

2. The assembly of claim 1 wherein the linear-conductive-structures are bitlines.

3. The assembly of claim 1 wherein the conductive-shield-structures include metal.

4. The assembly of claim 1 wherein the conductive-shield-structures include doped semiconductor material.

5. The assembly of claim 1 wherein the conductive-shield-structures include one or more of metal silicide, metal carbide, metal nitride and metal boride.

6. The assembly of claim 1 comprising dielectric regions between the conductive-shield-structures and the linear-conductive-structures.

7. The assembly of claim 6 wherein the dielectric regions comprise silicon dioxide.

8. The assembly of claim 6 wherein the dielectric regions comprise gas-filled voids.

9. The assembly of claim 8 wherein the gas-filled voids extend to under the conductive-shield-structures.

10. The assembly of claim 6 wherein the dielectric regions comprise low-k material.

11. The assembly of claim 10 wherein said low-k material includes porous silicon oxide.

12. The assembly of claim 10 wherein said low-k material includes doped silicon oxide.

13. The assembly of claim 10 wherein said low-k material includes carbon-doped silicon oxide.

14. The assembly of claim 10 wherein said low-k material includes boron-doped silicon oxide.

15. The assembly of claim 10 wherein said low-k material includes porous silicon nitride.

16. The assembly of claim 10 wherein said low-k material includes a laminate of two or more different compositions.

17. The assembly of claim 1 wherein the charge-storage-material is charge-trapping-material.

18. The assembly of claim 17 wherein the charge-trapping-material comprises silicon nitride.

19. An assembly, comprising:
channel-material-pillars;
memory cells along the channel-material-pillars; the memory cells including charge-storage-material, charge-blocking-material and tunneling material;
linear-conductive-structures vertically offset from the channel-material-pillars and being electrically coupled with the channel-material-pillars through conductive interconnects; the linear-conductive-structures being spaced from one another by intervening regions; and
conductive-shield-structures within the intervening regions and being spaced from the linear-conductive-structures by insulative regions.

20. The assembly of claim 19 wherein each of the intervening regions has a first thickness along a cross-section of the assembly; wherein each of the conductive-shield-structures has a second thickness along the cross-section of the assembly; and wherein the second thickness is within a range of from about 10% to about 60% of the first thickness.

21. The assembly of claim 20 wherein the range is from about 20% to about 40% of the first thickness.

22. The assembly of claim 19 wherein the linear-conductive-structures are bitlines.

23. The assembly of claim 22 wherein each of the bitlines has a first vertical dimension along a cross-section of the assembly; wherein each of the conductive-shield-structures has a second vertical dimension along the cross-section of the assembly; and wherein the second vertical dimension is greater than the first vertical dimension.

24. The assembly of claim 22 wherein each of the bitlines has a first vertical dimension along a cross-section of the assembly; wherein each of the conductive-shield-structures has a second vertical dimension along the cross-section of the assembly; and wherein the second vertical dimension is less than the first vertical dimension.

25. The assembly of claim 19 wherein the conductive interconnects include metal-containing-regions over conductively-doped-semiconductor-regions.

26. The assembly of claim 25 wherein the metal-containing-regions include tungsten, and wherein the conductively-doped-semiconductor-regions include conductively-doped silicon.

27. The assembly of claim 19 wherein the conductive-shield-structures are electrically coupled with a reference-voltage-source.

28. The assembly of claim 27 wherein the reference-voltage-source is dynamically controlled during operation of the memory cells.

29. The assembly of claim 27 wherein the reference-voltage-source is at a static voltage during operation of the memory cells.

30. The assembly of claim 27 wherein the reference-voltage-source is at electrical ground voltage during operation of the memory cells.

31. An assembly, comprising:
channel-material-pillars;
memory cells along the channel-material-pillars; the memory cells including charge-storage-material;
linear-conductive-structures vertically offset from the channel-material-pillars and being electrically coupled with the channel-material-pillars; intervening regions being between the linear-conductive-structures;
conductive-shield-structures within the intervening regions; and
a reference-plate-structure over the conductive-shield-structures and being electrically coupled with the conductive-shield-structures.

32. The assembly of claim 31 wherein a parasitic capacitance between neighboring linear-conductive-structures is about 0.

33. The assembly of claim 31 comprising dielectric regions between the conductive-shield-structures and the linear-conductive-structure.

34. The assembly of claim 33 wherein' the dielectric regions comprise gas-filled voids.

35. The assembly of claim 33 wherein' the dielectric regions comprise low-k material.

36. The assembly of claim 31 wherein a parasitic capacitance between neighboring linear-conductive-structures is less than or equal to about 5 aF.

37. The assembly of claim 31 wherein the conductive-shield-structures are at a first conductive level, and wherein the reference-plate-structure is at a second conductive level which is immediately above the first conductive level.

38. The assembly of claim 31 wherein the conductive-shield-structures are at a first conductive level, and wherein the reference-plate-structure is at a second conductive level which is offset from the first conductive level by one or more intervening conductive levels.

39. The assembly of claim 31 wherein the reference-plate-structure is solid across an entire expanse of the reference-plate-structure.

40. The assembly of claim 31 wherein the reference-plate-structure is perforated.

* * * * *